(12) United States Patent
McClellan et al.

(10) Patent No.: US 10,763,812 B2
(45) Date of Patent: Sep. 1, 2020

(54) SYSTEMS AND METHODS FOR IDENTIFYING AND REMEDIATING SOUND MASKING

(71) Applicant: iZotope, Inc., Cambridge, MA (US)

(72) Inventors: James McClellan, Cambridge, MA (US); Gordon Wichern, Roslindale, MA (US); Hannah Robertson, Cambridge, MA (US); Aaron Wishnick, Brooklyn, NY (US); Alexey Lukin, Somerville, MA (US); Matthew Hines, Brookline, MA (US); Nicholas LaPenn, Somerville, MA (US)

(73) Assignee: iZotope, Inc., Cambridge, MA (US)

( * ) Notice: Subject to any disclaimer, the term of this patent is extended or adjusted under 35 U.S.C. 154(b) by 0 days.

(21) Appl. No.: 16/512,257

(22) Filed: Jul. 15, 2019

(65) Prior Publication Data

US 2019/0341898 A1 Nov. 7, 2019

Related U.S. Application Data

(60) Division of application No. 16/250,486, filed on Jan. 17, 2019, now Pat. No. 10,396,744, which is a (Continued)

(51) Int. Cl.
*H03G 5/16* (2006.01)
*G10L 21/02* (2013.01)
(Continued)

(52) U.S. Cl.
CPC ............ *H03G 5/165* (2013.01); *G10L 21/02* (2013.01); *H03G 3/32* (2013.01); *H03G 5/005* (2013.01);
(Continued)

(58) Field of Classification Search
CPC .......... H03G 5/165; H03G 3/32; H03G 5/005; H03G 9/025; G10L 21/02; H04R 3/04; H04H 60/04
See application file for complete search history.

(56) References Cited

U.S. PATENT DOCUMENTS 5,228,093 A * 7/1993 Agnello ................. H04H 60/04
381/103
5,864,820 A * 1/1999 Case ...................... H04B 1/665
704/278

(Continued)

OTHER PUBLICATIONS

Invitation to Pay Additional Fees dated Jul. 27, 2018 in connection with International Application No. PCT/US2018/034336.
(Continued)

*Primary Examiner* — Andrew L Sniezek
(74) *Attorney, Agent, or Firm* — Wolf, Greenfield & Sacks, P.C.

(57) ABSTRACT

Some embodiments of the invention are directed to enabling a user to easily identify the frequency range(s) at which sound masking occurs, and addressing the masking, if desired. In this respect, the extent to which a first stem is masked by one or more second stems in a frequency range may depend not only on the absolute value of the energy of the second stem(s) in the frequency range, but also on the relative energy of the first stem with respect to the second stem(s) in the frequency range. Accordingly, some embodiments are directed to modeling sound masking as a function of the energy of the stem being masked and of the relative energy of the masked stem with respect to the masking stem(s) in the frequency range, such as by modeling sound masking as loudness loss, a value indicative of the reduction in loudness of a stem of interest caused by the presence of one or more other stems in a frequency range.

20 Claims, 11 Drawing Sheets

Related U.S. Application Data continuation of application No. PCT/US2018/034336, filed on May 24, 2018.

(60) Provisional application No. 62/516,601, filed on Jun. 7, 2017.

(51) Int. Cl.
*H03G 3/32* (2006.01)
*H03G 5/00* (2006.01)
*H03G 9/02* (2006.01)
*H04R 3/04* (2006.01)
*H04H 60/04* (2008.01)

(52) U.S. Cl.
CPC ............... *H03G 9/025* (2013.01); *H04R 3/04* (2013.01); *H04H 60/04* (2013.01)

(56) References Cited

U.S. PATENT DOCUMENTS

| | | |
|---|---|---|
| 9,530,396 B2 | 12/2016 | Gehring |
| 2007/0225841 A1 | 9/2007 | Aiso |
| 2010/0241256 A1* | 9/2010 | Goldstein ................ H04R 5/04 700/94 |
| 2013/0060364 A1 | 3/2013 | Kamihara et al. |
| 2013/0166053 A1 | 6/2013 | Ramirez |
| 2015/0003625 A1 | 1/2015 | Uhle et al. |
| 2016/0203830 A1* | 7/2016 | Chen ...................... H03G 7/002 381/106 |
| 2017/0155368 A1 | 6/2017 | Seefeldt |
| 2019/0158052 A1 | 5/2019 | McClellan et al. |

OTHER PUBLICATIONS

International Search Report and Written Opinion dated Sep. 25, 2018 in connection with International Application No. PCT/US2018/034336.

International Preliminary Report on Patentability dated Dec. 19, 2019 in connection with International Application No. PCT/US2018/034336.

PCT/US2018/034336, dated Dec. 19, 2019, International Preliminary Report on Patentability.

\* cited by examiner

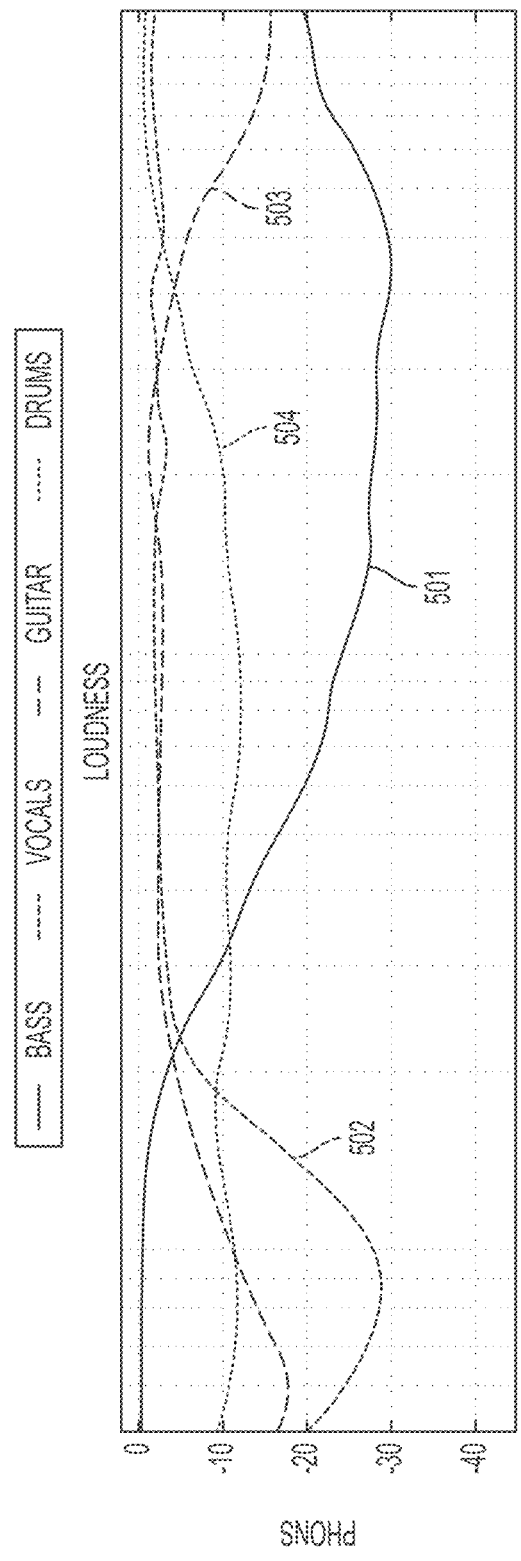
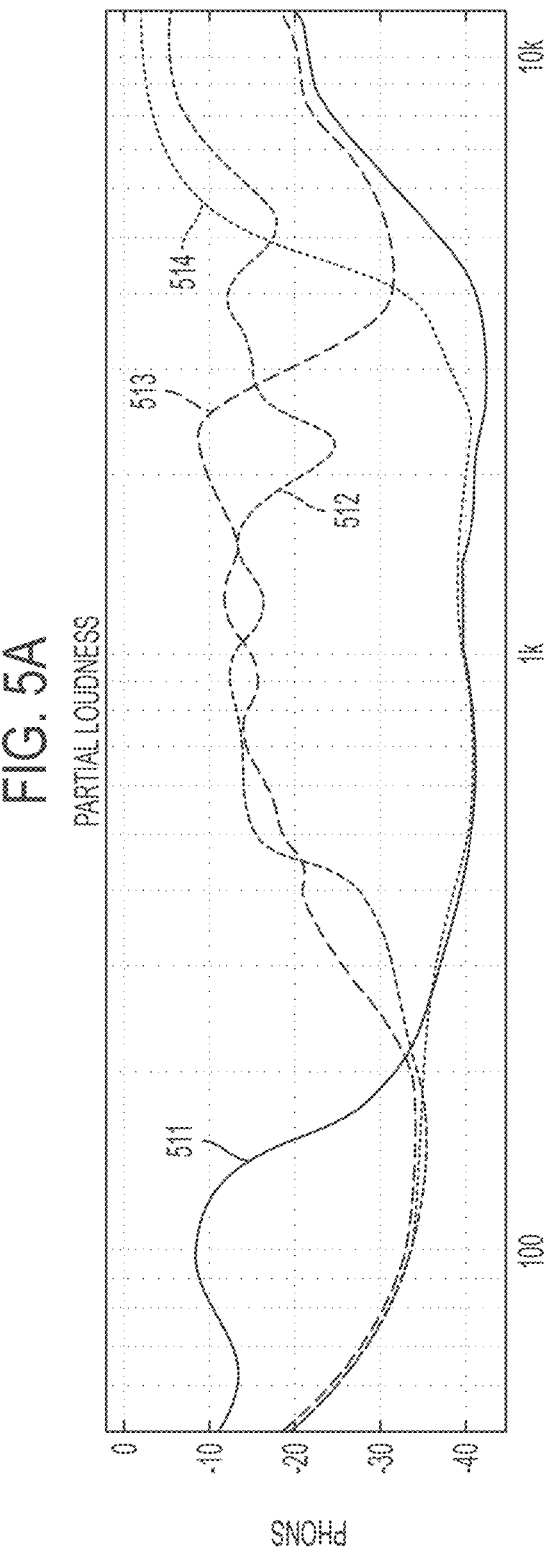
FIG. 5A
FIG. 5B

SYSTEMS AND METHODS FOR IDENTIFYING AND REMEDIATING SOUND MASKING

RELATED APPLICATIONS

This application is a divisional of commonly assigned U.S. patent application Ser. No. 16/250,486, filed Jan. 17, 2019, entitled "Systems And Methods For Identifying And Remediating Sound Masking", which is a continuation of commonly assigned International Patent Application No. PCT/US2018/034336, filed May 24, 2018, entitled "Systems and Methods For Identifying And Remediating Sound Masking", which claims priority to commonly assigned U.S. Provisional Patent Application Ser. No. 62/516,601, filed Jun. 7, 2017, entitled "Systems and Methods For Identifying And Remediating Sound Masking". The entirety of each of the documents listed above is incorporated herein by reference.

BACKGROUND

Audio production tools exist that enable users to produce high-quality audio. For example, some audio production tools enable users to record one or more audio sources (e.g., vocals and/or speech captured by a microphone, music played with an instrument, etc.), process the audio (e.g., to master, mix, design, and/or otherwise manipulate the audio), and/or control its playback. Audio production tools may be used to produce audio comprising music, speech, sound effects, and/or other sounds.

Some computer-implemented audio production tools provide a graphical user interface with which users may complete various production tasks on audio source inputs. For example, some tools may receive audio input and generate one or more digital representations of the input, which a user may manipulate using a graphical user interface, such as to obtain desired audio output through equalization and/or other operations.

Sound equalization is a technique used by sound engineers to alter a sound recording by applying filters to sound in one or more frequency ranges, so as to boost or attenuate spectral portions of a track. For example, high-pass filters may be used to boost higher frequencies and attenuates lower frequencies. By contrast, low-pass filters may be used to boost lower frequencies and attenuate higher frequencies. Equalization may, for example, be used to create the impression that certain sounds in a track or multi-track recording are farther or closer than others.

BRIEF DESCRIPTION OF DRAWINGS

Various aspects and embodiments of the invention are described below with reference to the following figures. It should be appreciated that the figures are not necessarily drawn to scale. Items appearing in multiple figures are indicated by the same reference number in all the figures in which they appear.

FIGS. 5A-5B are plots illustrating examples of loudness and partial loudness, respectively, according to some non-limiting embodiments of the invention.

DETAILED DESCRIPTION

I. Overview

Figure 1:
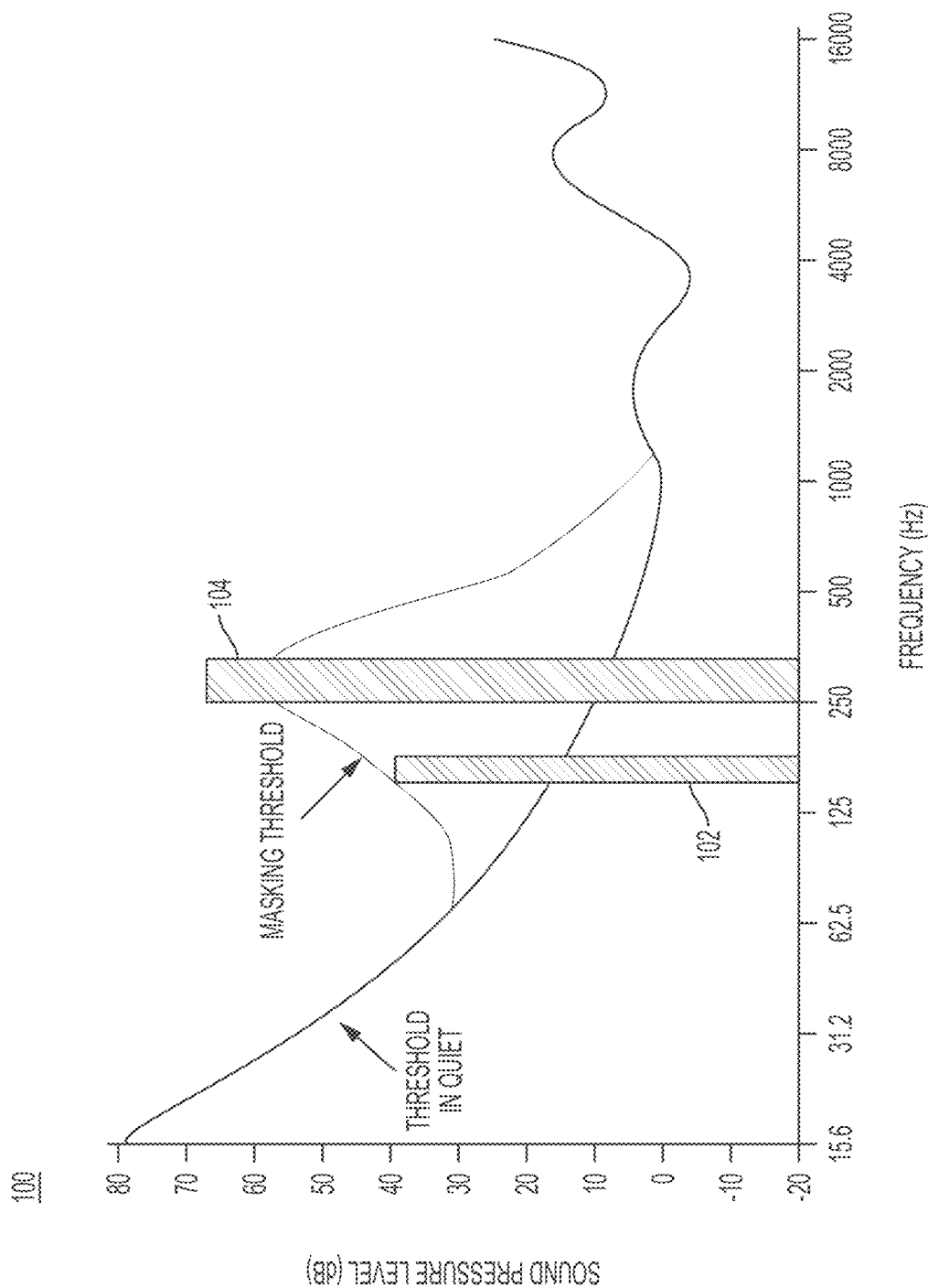
FIG. 1 is a plot illustrating a sound masking phenomenon.

Sound masking occurs when a listener's ability to perceive one sound is negatively affected by the presence of another sound. For example, sound masking may occur when a stem of interest is masked by one or more other stems. (The term "stem" is used herein to mean a digital representation of an audio track in a multi-track recording, although it is to be understood that masking may occur in a single-track recording.) This may be the case when different stems include audio content that compete with one another in a particular frequency range. For example, bass guitar and drums have the tendency to compete with each other in the low frequencies. FIG. 1 is a plot illustrating the effects of sound masking. Plot 100 depicts sound pressure level, expressed in decibels (dB), as a function of frequency. The curve labeled "threshold in quiet" represents a typical frequency-dependent audibility threshold of a human ear in the absence of masking sounds. Sounds having pressure levels that are above the threshold in quiet are audible. For example, tone 102, a sound tone having a center frequency of about 150 Hz, has a sound pressure that is above the threshold at that frequency, and as a result is audible. By contrast, sounds having pressure levels that are below the threshold are not typically audible to humans.

When multiple sounds occur simultaneously, a human's ability to hear a particular sound may be impaired by the presence of the other sounds, even if the particular sound has a pressure level that is above the threshold. For example, in FIG. 1, masking tone 104 has a center frequency of about 300 Hz. When masking tone 104 occurs, its presence effectively increases the threshold of audibility in a frequency range proximate to its center frequency. The extent to which the threshold is increased may depend on the magnitude of the masking tone 104. The curve labeled "masking threshold" represents the effective threshold of audibility when masking tone 104 is played. Tone 102, which is above the "threshold in quiet" and is thus typically audible when no masking tones are present, is sufficiently close in frequency to the masking tone, and as a result its audibility may be impaired. Even though the presence of a masking sound does not modify the pressure level of a tone, it may cause a loss of relative loudness with respect to such a tone. That is, the tone is masked by the masking sound.

The Assignee has appreciated that conventional methods for addressing sound masking in audio mixes are often imprecise, error-prone, and time- and labor-intensive, as they rely heavily on a user's ability to recognize when sound masking is occurring, and in which frequency range(s). While a sound engineer may have enough experience and talent to recognize that sound masking is occurring, addressing the masking often involves significant trial-and-error before he/she can identify the frequency(ies) at which the masking is occurring, and address the masking so as to produce satisfying sound quality.

Some embodiments of the present invention provide methods and systems for enabling a user to easily identify the frequency range(s) at which sound masking occurs, so that the masking may be addressed, if the user so desires. Some embodiments may therefore provide for an approach to identifying and addressing sound masking which is more systematic, efficient, and/or accurate than conventional approaches allow.

The Assignee has appreciated that the extent to which a first stem is masked by one or more second stems in a frequency range depends not only on the absolute value of the energy of the second stem(s) in the frequency range, but also on the relative energy of the first stem with respect to the second stem(s) in the frequency range. Accordingly, some embodiments of the invention are directed to modeling sound masking as a function of the energy of the stem being masked and of the relative energy of the masked stem with respect to the masking stem(s) in the frequency range. This may be accomplished, for example, by modeling sound masking as loudness loss, a value indicative of the reduction in loudness of a stem of interest caused by the presence of one or more other stems in a frequency range.

Some embodiments of the invention are directed to methods for identifying masking which affects a track in a multi-track recording comprising multiple stems, wherein each stem corresponds to a track. For example, some embodiments may involve computing the loudness and the partial loudness of a stem of interest in each of a plurality of frequency ranges. (The term "loudness" is used herein to refer to how strongly the sound in a stem of interest is perceived by a human when the sound occurs in isolation (i.e., in the absence of sound in additional stems), and the term "partial loudness" is used herein to refer to how strongly the sound in a stem of interest is perceived by a human when the sound occurs concurrently with the sound in one or more additional stems.) Loudness and partial loudness may be computed in any of numerous ways. In some embodiments, loudness and partial loudness may be computed in accordance with a psychoacoustic model, which may define how humans perceive sound as a function of frequency. One example of a psychoacoustic model which may be used in computing loudness and partial loudness is described in G. Wichern et al., "Quantitative Analysis of Masking in Multitrack Mixes Using Loudness Loss", Audio Engineering Society (September 2016), which is herein incorporated by reference in its entirety. This paper cites the psychoacoustic model described in P. Kabal's "An Examination and Interpretation of ITU-R BS.1387: Perceptual Evaluation of Audio Quality, 2002-05-01", which is available at http://www.mp3-tech.org/programmer/docs/kabalr2002.pdf. Of course, any suitable model, whether psychoacoustic in nature or not, may be used to compute loudness and/or partial loudness.

In some embodiments, loudness and partial loudness for a given stem are computed as non-linear functions of one or more excitation patterns, where an excitation pattern is a representation of the distribution of acoustic excitation at different frequencies. An excitation pattern may, in some embodiments, be computed for a stem after the stem is passed through a filter which models the frequency response of the human ear. Loudness may, in some embodiments, be computed as a function of frequency by passing the excitation pattern through a frequency-dependent compressive nonlinearity, wherein the extent to which compression is applied depends on whether the frequency is below the audibility threshold, above an "extremely loud" threshold, or between the two extremes. Partial loudness may, in some embodiments, be computed in a similar fashion as loudness, with the audibility threshold being replaced by a masking threshold, which may be computed from the excitation pattern for the masking stem(s). The loudness and partial loudness may then, in some embodiments, be integrated over an equivalent rectangular bandwidth (ERB) scale to obtain short-term and long-term loudness values. Loudness loss may then be computed based upon the loudness and partial loudness. For example, in some embodiments, loudness loss may be computed as the difference between loudness and partial loudness.

Those skilled in the art will appreciate that sound masking is a common phenomenon which occurs to some extent in almost all multi-track recordings, and that it may even be desirable in certain circumstances. As such, some embodiments of the inventions provide techniques for identifying to a user only the frequency range(s) in which sound masking is most prevalent, so that the user is not inundated with notifications of sound masking occurring. For example, in some embodiments, only the frequency range(s) in which loudness loss exceeds a predetermined threshold (e.g., loudness loss in the $99^{th}$ percentile) may be identified to the user, so that he/she may apply corrective measures (e.g., via sound equalization) if desired. By identifying the frequency range(s) in which loudness loss is most prevalent, some embodiments of the invention may enable the user to quickly and easily determine where corrective measures will positively affect sound quality.

II. Identifying Problematic Sound Masking

Figure 2:
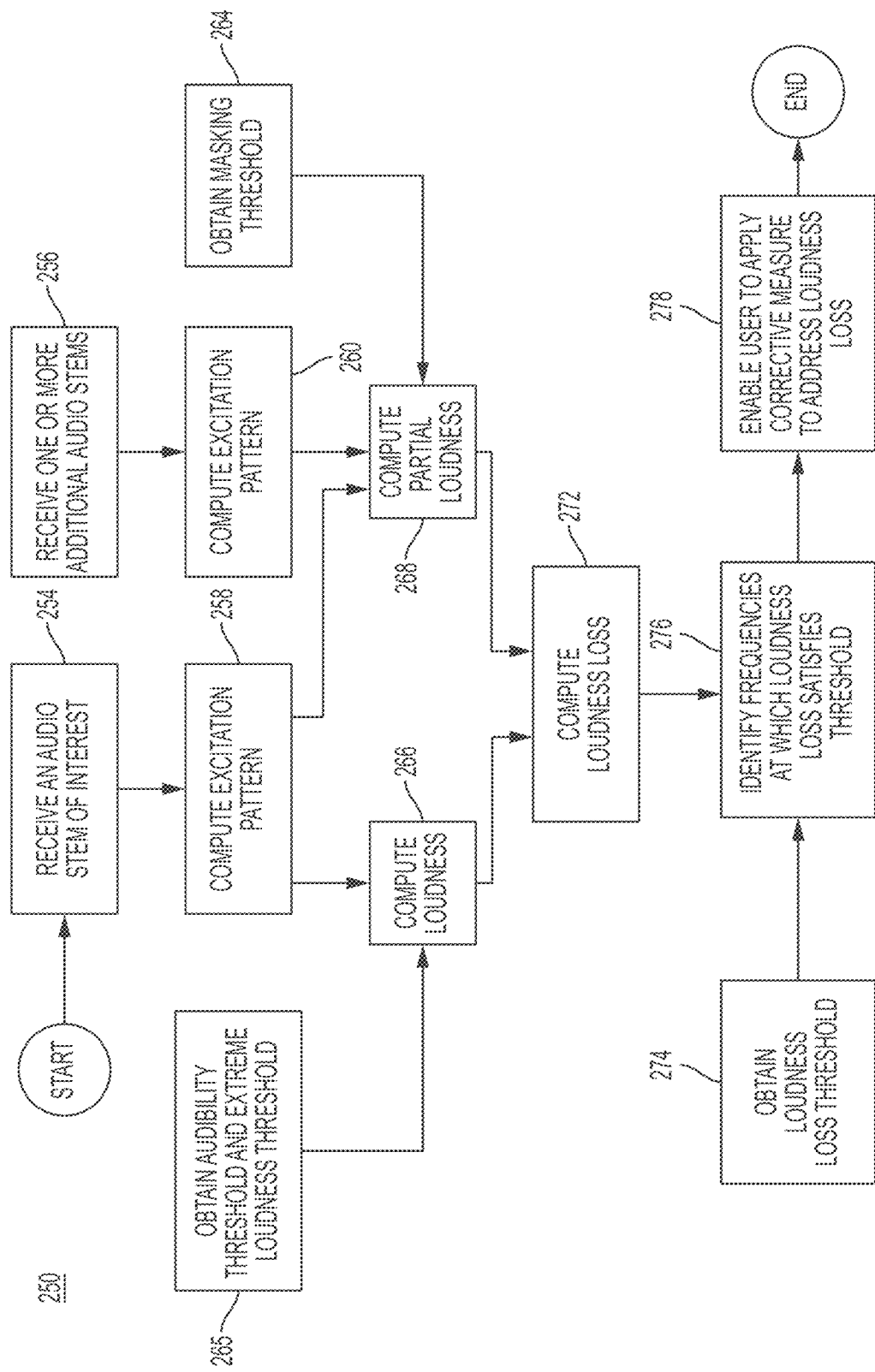
FIG. 2 is a flowchart illustrating a representative method for addressing sound masking, according to some non-limiting embodiments of the invention.
Figure 3A:
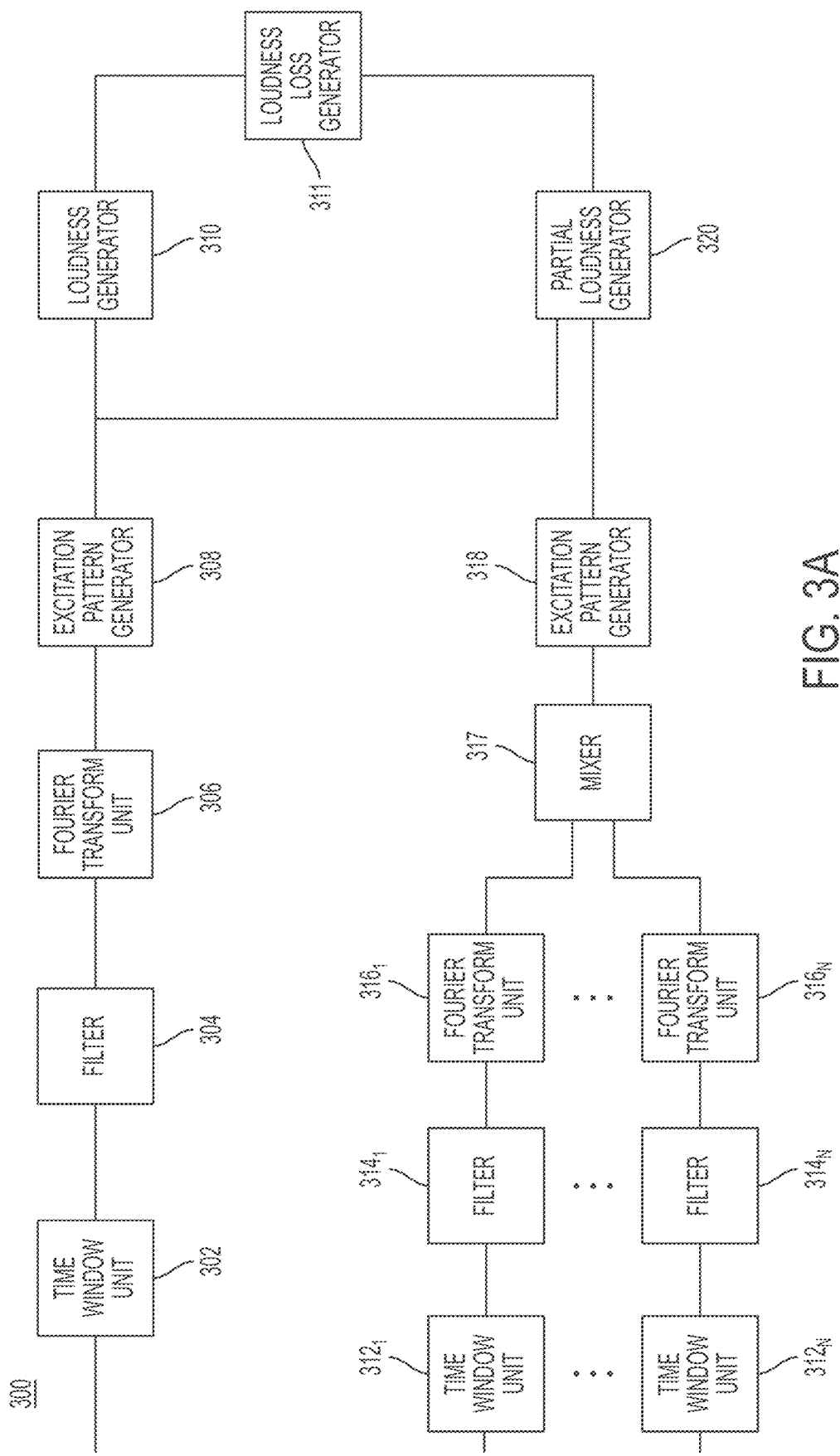
FIG. 3A is a block diagram illustrating a representative system for addressing sound masking, according to some non-limiting embodiments of the invention.

FIG. 2 depicts a representative process 250 for identifying and addressing sound masking. FIG. 3A depicts a representative system for performing representative process 250. Representative system 300 may be implemented using any suitable combination of hardware and/or software components. For example, representative system 300 may comprise an audio recording system, digital audio workstation, personal computer, portable device (e.g., tablet, smartphone, gaming console, etc.), and/or any other suitable system comprising any suitable combination of components. In some embodiments, representative system 300 may include one or more software programs which, when executed, present a graphical user interface with which a user may interact to invoke certain functions.

Representative process 250 begins in acts 254 and 256, which may be performed concurrently or at different times. In act 254, a stem of interest is received, and in act 256, one or more additional stems are received. Each of the stems received in acts 254 and 256 may, for example, include sound which is generated by a musical instrument, human (e.g., vocals), microphone, computer system, and/or any other suitable implement(s). For example, each stem may represent a track in a multi-track recording which consists of sound produced by a particular instrument. For example, the stem received in act 254 may represent a recording of audio generated with a guitar, and two stems received in act 256 may respectively represent recordings of drums and a bass guitar. Of course, the invention is not limited to a mode of implementation wherein each stem includes sound from a single instrument or other implement. For example, a stem may represent a recording of sounds produced by multiple instruments.

In some embodiments, a time window function may be applied to time-delimit the stems received in acts 254 and 256. In this respect, time window units 302 and 312$_1$ . . . 312$_N$ (FIG. 3A) may apply a time window function to limit the stems to a particular time window. Any suitable time window function(s) may be used, such as a Hann function, Hamming function, Blackman function, Gaussian function, cosine function, and/or any other suitable function(s). In representative system 300, time window unit 302 time-delimits the stem of interest received in act 254, and time window units 312$_1$ . . . 312$_N$ time-delimits the N additional stems received in act 256. Time window units 302 and 312$_1$ . . . 312$_N$ need not all apply the same time window function to the stems which are received.

In some embodiments, acts 254 and 256 involve applying a filter which models the frequency response of the human ear to the stems which are received. In representative system 300 (FIG. 3A), filters 304 and 314$_1$ . . . 314$_N$ are applied. Any suitable filter(s) may be used for this purpose. For example, some embodiments may use a finite impulse response (FIR) filter which models the frequency response of a human's outer and middle ear.

In some embodiments, acts 254 and 256 may involve transforming the received stems to the frequency domain. Any suitable transformation technique(s) may be used for this purpose. In representative system 300 (FIG. 3A), Fourier transform unit 306 and 316$_1$ . . . 316$_N$ compute Fourier transforms of the filtered stems. A Fourier transform may be computed in any suitable way. For example, a fast Fourier transform (FFT) and/or a short-time Fourier transform (STFT) may be used. It should be appreciated that in representative system 300, Fourier transform units 306 and 316$_1$ . . . 316$_N$ need not all employ the same transformation technique.

In some embodiments, a Fourier transform may have a variable frequency resolution across the audible frequencies, so that certain frequency sub-bands of interest include a larger number of samples (and therefore greater frequency resolution) than other frequency sub-bands. By limiting the frequency resolution in certain frequency sub-bands, some embodiments of the invention may limit the computational expense associated with transformation to the frequency domain. Of course, the invention is not limited to limiting the frequency resolution in one or more frequency sub-bands. For example, some embodiments of the invention may define the bandwidths of the sub-bands so that each has similar spectral resolution.

In representative system 300, the Fourier transforms of the stems received in the act 256 are combined using mixer 317. Combination of the transforms may be accomplished in any suitable way. For example, in some embodiments, a summation function may be used.

It should be appreciated that although the depiction of representative system 300 in FIG. 3A indicates that the stem received in act 254 and the stem(s) received in the act 256 are time-delimited, filtered and transformed in that sequence, the invention is not limited to such an implementation. In some embodiments, the order of these operations may be changed, and/or one or more operations may be omitted.

Representative process 250 then proceeds to acts 258 and 260, wherein an excitation pattern is computed for the transform of the stem of interest and for the transforms of the one or more additional stems, respectively. Acts 258 and 260 may be performed concurrently, or at different times. In representative system 300 (FIG. 3A), excitation pattern generator 308 performs act 258, and excitation pattern generator 318 performs act 260.

Figure 3B:
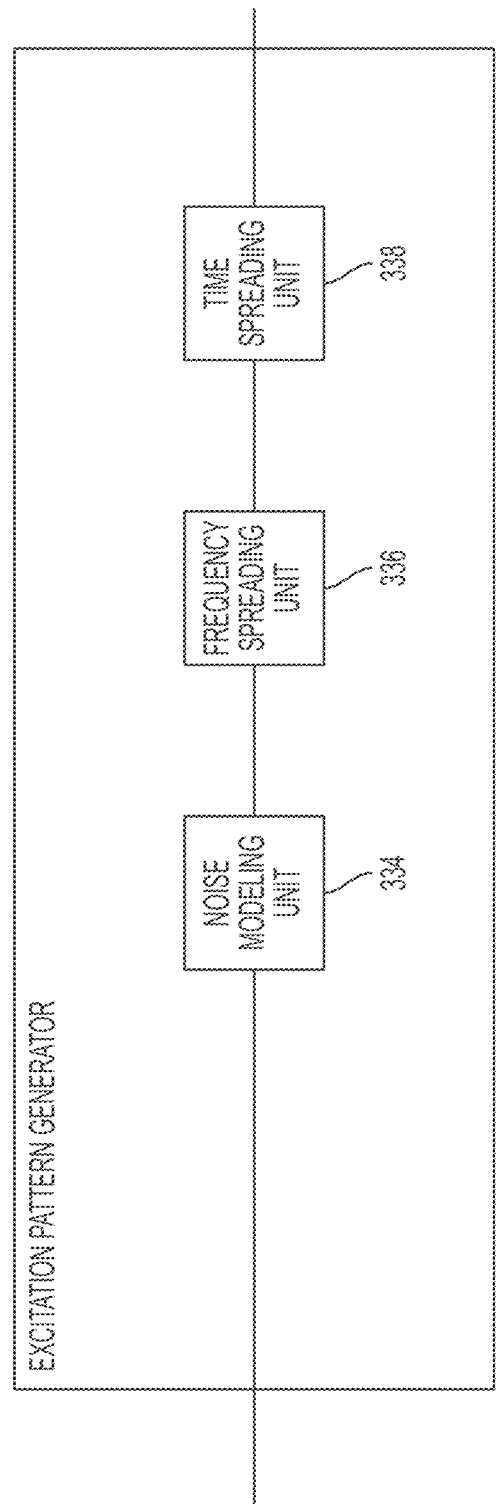
FIG. 3B is a block diagram illustrating an example of an excitation pattern generator, according to some non-limiting embodiments of the invention.

A representative excitation pattern generator (e.g., comprising excitation pattern generator 308 and/or 318) is shown in greater detail in FIG. 3B. The excitation pattern generator shown in FIG. 3B comprises noise modeling unit 334, frequency spreading unit 336, and time spreading unit 338. The excitation pattern generator shown in FIG. 3B is similar in some respects to that which is described in the section entitled "Pattern Processing" in P. Kabal, "An Examination and Interpretation of ITU-R BS.1387: Perceptual Evaluation of Audio Quality", Department of Electrical & Computer Engineering, McGill University (2002), available at http://www.mp3-tech.org/programmer/docs/kabalr2002.pdf, which is incorporated herein by reference in its entirety. In the excitation pattern generator shown in FIG. 3B, noise modeling unit 334 may be used to model noise of any type. Examples of noise that may be modeled using modeling unit 334 include, but are not limited to, white noise, pink noise, brown noise, blue noise, violet noise and/or grey noise.

Frequency spreading unit 336 may, for example, be used to spread the spectral content of a frequency sub-band through one or more adjacent sub-bands, so that frequency selectivity of auditory filters can be properly modeled. In some embodiments, frequency spreading unit 336 may comprise one or more rounded exponential filters. Each rounded exponential filter may, for example, have a center frequency which ranges from 50 Hz to 15 kHz, and the filters may be uniformly distributed on the equivalent rectangular bandwidth (ERB) frequency scale. Of course, any suitable spreading function approach(es) may alternatively, or additionally, be used.

Time spreading unit 338 may be configured to spread the content of the temporal portions of each received stem to adjacent temporal portions, so as to smooth the stem in the time domain.

It should be appreciated that although the excitation pattern generator shown in FIG. 3B includes noise modeling unit 334, frequency spreading unit 336 and time spreading unit 338, the invention is not limited to employing an excitation pattern generator which performs all of these functions, or the depicted functions in the order described above. Any one or more of these functions may be omitted in generating an excitation pattern for the stem of interest and/or for the additional stem(s), and/or the order of these operations may be different than that which is described above.

At the completion of acts 258 and 260, representative process 250 proceeds to act 266, wherein loudness is computed for the excitation pattern computed in act 258, using an audibility threshold and an extreme loudness threshold obtained in act 265. In some embodiments, the audibility threshold may represent a minimum excitation level that the human ear is able to perceive at a particular frequency, and the extreme loudness threshold may, for example, represent the highest level that a human ear may tolerate at a particular frequency. The audibility and extreme loudness thresholds may be frequency-dependent parameters, and may be specified by a user (based on any suitable parameter(s)), or defined based upon a psychoacoustic model.

In representative system 300 (FIG. 3A), loudness generator 310 is used to compute loudness for the stem of interest.

Loudness may be computed for the stem of interest in any of numerous ways. In some embodiments of the invention, the cross-adaptive Moore-Glasberg loudness model, described in A. J. R. Simpson, "A practical step-by-step guide to time-varying sounds", Journal of the Audio Engineering Society, 50(5), pp. 331-42 (2002), which is incorporated herein by reference in its entirety, may be used to compute loudness for the stem of interest. The loudness which is computed for the stem of interest may represent instantaneous loudness, a time-smoothed long-/short-term loudness, specific loudness, and/or any other suitable loudness measure(s).

Figure 4:
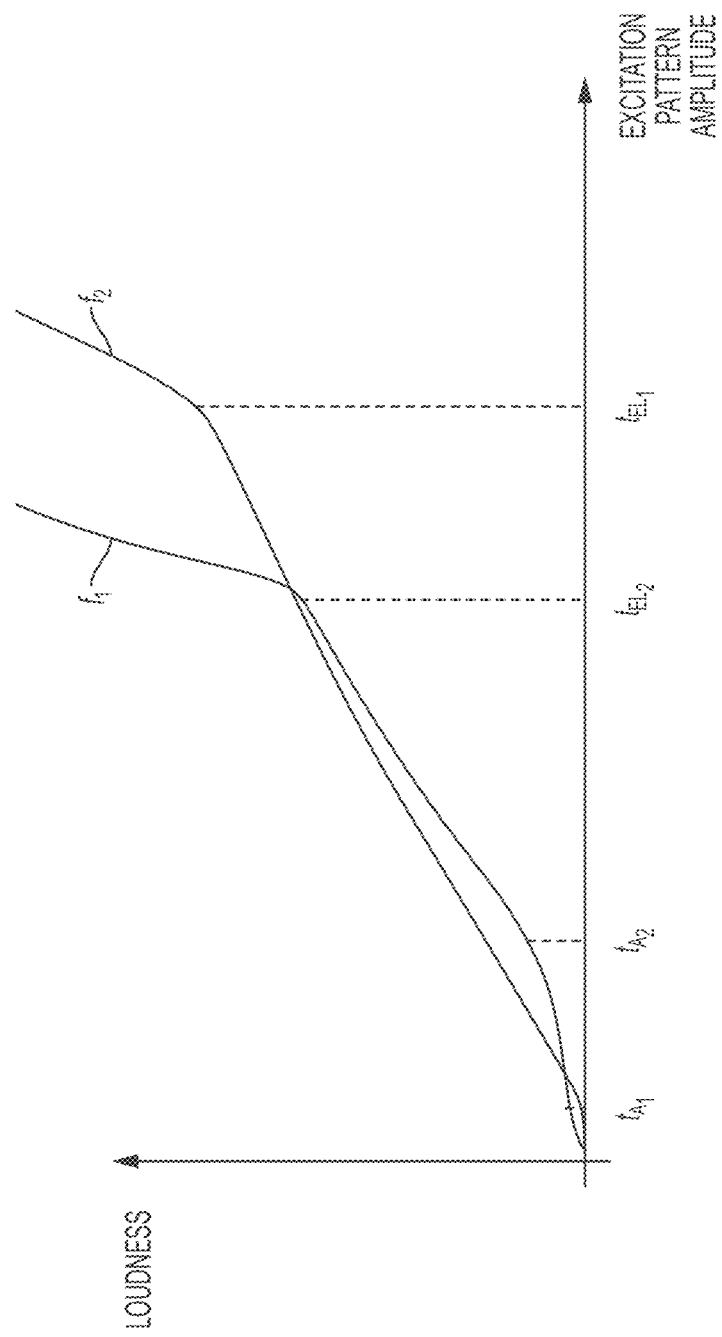
FIG. 4 is a plot illustrating examples of loudness as a function of excitation pattern amplitude, according to some non-limiting embodiments of the invention.

Some embodiments of the invention may involve computing loudness for the stem of interest using one or more compressive non-linear functions which represent the extent to which sounds at different frequencies are perceived by the human ear. One representative compressive non-linear function is illustrated in FIG. 4. Specifically, FIG. 4 depicts a plot on which the loudness of two different frequencies $f_1$ and $f_2$ are shown as a function of the amplitude of a corresponding excitation pattern.

In the plot shown in FIG. 4, the loudness corresponding to frequency $f_1$ has three regions, including a first region which includes amplitudes below the audibility threshold $t_{A1}$ received in act 265, a second region which includes amplitudes between the audibility threshold $t_{A1}$ and the extreme loudness $t_{EL1}$ received in act 265, and a third region which includes amplitudes exceeding the extreme loudness threshold $t_{EL1}$. Similarly, the loudness corresponding to frequency $f_2$ also has three regions, including a first region which includes amplitudes below the audibility threshold $t_{A2}$ received in act 265, a second region which includes amplitudes between the audibility threshold $t_{A2}$ and the extreme loudness $t_{EL2}$ received in act 265, and a third region which includes amplitudes exceeding the extreme loudness threshold $t_{EL2}$. At amplitudes below the audibility threshold, loudness exhibits a slow growth rate with respect to excitation pattern amplitude, so that increases in excitation pattern amplitude are barely perceived by a human, if at all. At amplitudes between the audibility threshold and the extreme loudness threshold, loudness exhibits a greater growth rate, so that increases in excitation pattern amplitude are clearly perceived as increases in loudness by a human. At amplitudes above the extreme loudness threshold, small increases in excitation pattern amplitude give rise to substantial increases in loudness, so that sound in this region is perceived as being unpleasantly loud by at least some humans. It can be seen from the plot shown in FIG. 4 that the loudness associated with a particular sound depends not only on excitation pattern amplitude, but also on the frequency(ies) in which the amplitude is exhibited.

Referring again to representative process 250 (FIG. 2), partial loudness is computed in act 268, either concurrently or at a different time than loudness is computed in act 266. In representative process 250, partial loudness is computed based upon the excitation pattern for the stem of interest computed in act 258, the excitation pattern for the additional stem(s) computed in act 260, and a masking threshold obtained in act 264. The masking threshold may, for example, represent a threshold of audibility as a function of frequency across the audible frequency range, so that sound levels below the masking threshold are not perceptible by a human as masking the stem of interest. The masking threshold obtained in act 264 may be defined based upon a psychoacoustic model, and/or in some other fashion (e.g., it may be computed from the additional stem(s) received in the act 256). Any suitable masking threshold(s) may be used. In representative system 300 (FIG. 3A), partial loudness generator 320 computes partial loudness based upon the excitation pattern for the stem of interest computed in act 258, the excitation pattern for the additional stem(s) computed in act 260, and the masking threshold obtained in act 264. Partial loudness may, for example, be computed using the Moore-Glasberg loudness model referenced above. As with the loudness computed in act 266, the partial loudness which is computed in act 268 may represent instantaneous loudness, a time-smoothed long-/short-term loudness, specific loudness, and/or any other suitable partial loudness measure(s).

The loudness computed in act 266 and the partial loudness computed in act 268 may be expressed in any suitable unit(s), such as phons (i.e., a decibel-like unit expressed on a logarithmic scale), sones (i.e., expressed on a linear scale), etc. In some embodiments, expressing loudness and partial loudness in phons may reduce the computational expense associated with determining loudness loss (as described in further detail below), since phons may be more susceptible than units like sones to straightforward mathematical operations (e.g., subtraction) to compute loudness loss. However, it should be appreciated that loudness, partial loudness, and loudness loss may be expressed in any suitable unit(s), as the invention is not limited in this respect.

At the completion of acts 266 and 268, representative process 250 proceeds to act 272, wherein loudness loss is computed. In representative system 300 (FIG. 3A), loudness loss is computed by loudness loss generator 311. Loudness loss may be computed in any of numerous ways. In some embodiments, loudness loss may be computed by as the difference between the loudness computed in act 266 and the partial loudness computed in act 268, so that loudness loss indicates a difference between how strongly the stem of interest is perceived by a human in isolation and how strongly the same stem is perceived in concurrence with the other stem(s). However, loudness loss is not limited to being computed in this way. For example, in some embodiments, loudness loss may be proportional to, but not equal to, the difference between loudness and partial loudness.

It should be appreciated that the invention is not limited to modeling sound masking based solely upon loudness loss. Any suitable computational approach(es) may be used to identify sound masking, as the invention is not limited in this respect.

Since loudness and partial loudness may, in some embodiments of the invention, vary as a function of frequency, in some embodiments loudness loss may vary as a function of frequency as well. That is, the stem of interest received in act 254 may be masked in certain frequency range(s) by the other stem(s) received in act 256, and not masked in other frequency ranges. Additionally, it should be appreciated that loudness loss may vary over time. For example, the extent to which the stem of interest received in act 254 is masked in certain frequency range(s) by the other stem(s) received in act 256 may vary over time by transient and/or intermittent sounds in the other stem(s).

It should further be appreciated that each track of a multi-track recording may be masked to a certain extent by one or more other tracks in the recording. For example, in a recording which includes tracks that respectively include audio produced by a bass, a guitar, a drum set, and vocals, the bass track may be masked by the drum track, the guitar track may be masked by the vocal track, the drum track may be masked by the guitar and vocal tracks, etc. Accordingly, some embodiments of the invention provide for computing loudness loss (e.g., using the portion of representative process 250 described above) for each track of a multi-track recording. For example, the loudness and partial loudness may be computed for the stem corresponding to each track, and loudness loss may be computed as the difference between the loudness and partial loudness of the stem.

At the completion of act 272, representative process 250 (FIG. 2) proceeds to act 276, wherein the frequency(ies) at which masking satisfies a particular threshold are identified to a user, based upon the loudness loss computed in act 272 and a loudness loss threshold obtained in act 274.

Any suitable loudness loss threshold may be used. In this respect, as noted above, the Assignee has appreciated that sound masking is a common phenomenon that occurs to some extent in almost all multi-track recordings. As such, in some embodiments, a loudness loss threshold may be selected which results in the user only being notified of a subset of the sound masking events which actually occur, to avoid inundating the user with notifications that such masking events have occurred. For example, in some embodiments, a loudness loss threshold is used which results in only the masking events with associated loudness loss in the $99^{th}$ or greater percentile being identified to the user. Of course, any suitable threshold(s) may be used, and each threshold may be defined in any suitable way. For example, a loudness loss threshold need not be based upon the magnitude of the loudness loss associated with a masking event. As one example, some embodiments may use a loudness loss threshold which is based at least in part upon the amount of time during which masking occurs, so as to avoid identifying fleeting and/or one-time sound masking events to the user. As another example, some embodiments may use a threshold which is based at least in part upon a loudness loss of particular magnitude occurring over a particular amount of time. Any suitable threshold(s) may be used.

Additionally, recognizing that some users may be more sensitive to sound masking than others, some embodiments of the invention may allow a user to manually define a loudness loss threshold. As another example, some embodiments may provide for a loudness loss threshold to be defined for each of a population of users based upon preferences demonstrated by the population. For example, machine learning techniques may be used to determine how user-defined loudness loss thresholds change over time, and set a threshold accordingly. Any of numerous techniques may be used.

The range of frequencies in which sound masking satisfying a threshold is identified in act 276 may be any suitable range. For example, in some embodiments, sound masking is identified in act 276 across the spectrum of frequencies which are audible to humans. Of course, the invention is not limited to being implemented in this manner. Sound masking may be identified in any one or more suitable frequency spectra.

Any suitable technique(s) may be used to identify loudness loss which satisfies a loudness loss threshold to a user. For example, a graphical user interface may be used, such as in the manner described below with reference to FIGS. 8A-8B.

At the completion of act 276, representative process 250 proceeds to act 278, which involves enabling a user to apply one or more corrective measures to address loudness loss. Examples of corrective measures include filtering, mixing, equalization, attenuation, amplification, panning, compression, and other operations. Such measures may be applied manually by a user (e.g., via a graphical user interface, one example of which is described below), may be applied automatically, and/or using may be applied using some combination of manual and automatic techniques. For example, in some embodiments, in response to identifying a particular quantity of loudness loss events occurring within a particular frequency range over a particular period of time, one or more levels associated with a masked stem and/or one or more masking stems may automatically be applied.

At the completion of act 278, representative process 250 completes.

It should be appreciated from the foregoing that some embodiments of the invention, by applying quantitative analysis techniques to the identification of sound masking, may enable a user to quickly and easily identify the frequency range(s) in which masking is occurring so that the masking may be addressed. By contrast, in conventional approaches, the user is forced to rely upon his/her experience and skill, and a painstaking trial-and-error process, to identify sound masking. As such, some embodiments of the invention may reduce the amount of time that a user may spend processing a body of audio content, make the audio production process more productive and pleasurable for the user overall, and free up the computational resources that the user may otherwise have expended trying to identify where sound masking is occurring for other tasks.

III. Loudness Loss as a Measure of Sound Masking

Some illustrative examples of loudness and partial loudness (e.g., computed according to representative process 250) are shown in FIGS. 5A and 5B, respectively. In the plots depicted in these figures, loudness and partial loudness (each expressed in phons) are shown as a function of frequency. FIG. 5A includes four loudness curves, including curve 501 for a stem representing audio produced by a bass guitar, curve 502 for a stem representing audio produced by vocals, curve 503 for a stem representing audio produced by a guitar, and curve 504 for a stem representing audio produced by a drum set. FIG. 5B includes four partial loudness curves 511, 512, 513 and 514, which correspond to the stems represented by curves 501, 502, 503 and 504, respectively.

It can be seen in FIG. 5A that the loudness of the bass guitar is much greater than the loudness of the other instruments at frequencies below approximately 200 Hz. It can also be seen that the difference between the loudness represented by curves 502, 503 and 504 in FIG. 5A and the partial loudness represented by corresponding curves 512, 513 and 514 in FIG. 5B is much greater than the difference between the loudness represented by curve 501 and the partial loudness represented by corresponding curve 511, indicating that the loudness loss for these instruments (i.e., computed as the difference between loudness and partial loudness) is significant in that frequency range. That is, the larger difference between the loudness represented by curves 502, 503 and 504 and the partial loudness represented by corresponding curves 512, 513 and 514 than the difference between the loudness represented by curve 501 and the partial loudness represented by curve 511 indicates that the bass guitar masks the vocals, guitar and drums in this frequency range.

It can also be seen that that the loudness of the vocals and the guitar represented by curves 502 and 503 is greater than the loudness of the bass guitar represented by curve 501 at frequencies between 500 Hz and 4 kHz. It can also be seen that the difference between the loudness of the bass guitar represented by curve 501 and the partial loudness of the bass guitar represented by corresponding curve 511 is not so great in this frequency range. However, it can further be seen from the "dip" in curve 512 at approximately 3.5-4.0 kHz that the difference between the loudness of the vocals represented by curve 502 and the partial loudness of the vocals represented by curve 512 becomes significant in this frequency range, indicating that the vocals are being masked by the guitar.

Figure 6A:
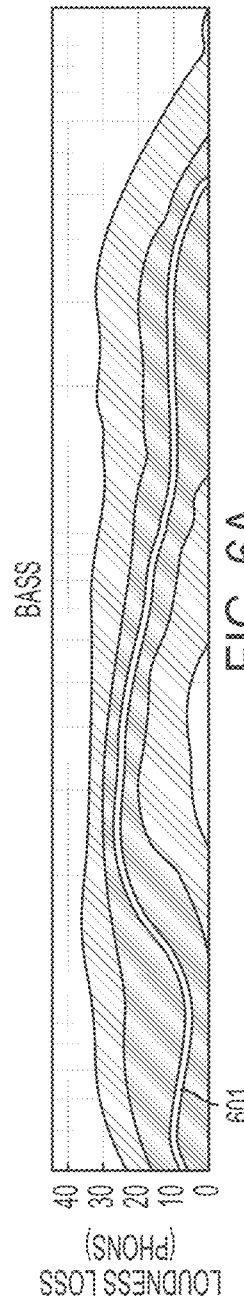
FIGS. 6A-6D are plots illustrating examples of loudness loss for various stems, according to some non-limiting embodiments of the invention.
Figure 6B:
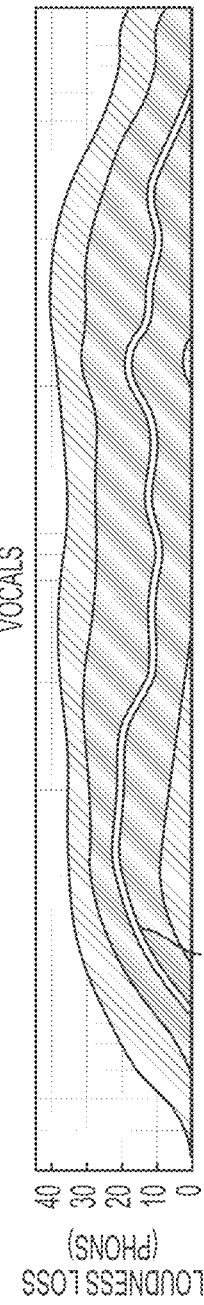
Figure 6C:
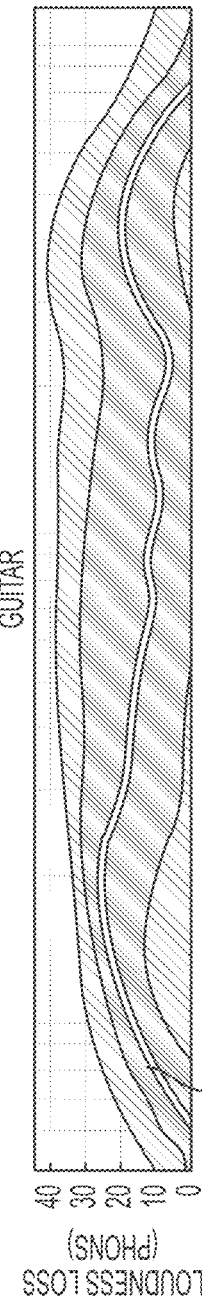
Figure 6D:
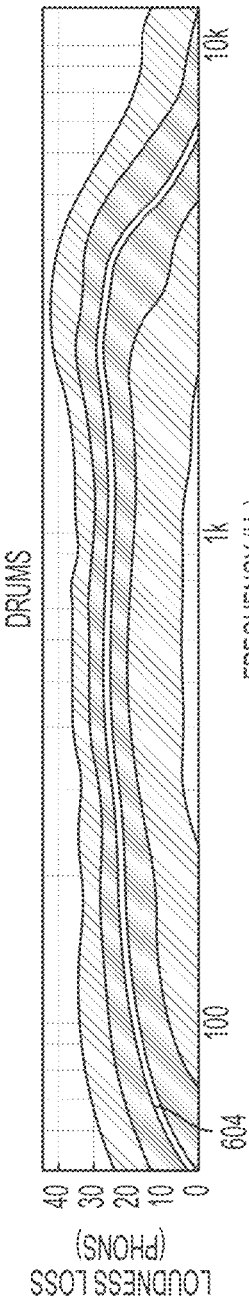

These phenomena are further illustrated in FIGS. 6A, 6B, 6C and 6D, which are plots showing loudness loss for stems representing the bass guitar, vocals, guitar and drums, respectively, for over a hundred multi-track recordings. Specifically, curve 601 in FIG. 6A represents the median loudness loss for the bass guitar, curve 602 in FIG. 6B represents the median loudness loss for the vocals, curve 603 in FIG. 6C represents the median loudness loss for the guitar, and curve 604 in FIG. 6D represents the median loudness loss for the drums. The dark shaded regions surrounding the curve representing median loudness loss in each plot represent loudness loss between the 25th percentile and the $75^{th}$ percentile, and the light shaded regions bordering loudness loss between the 25th percentile and the $75^{th}$ percentile represent loudness loss between the $1^{st}$ and $5^{th}$ percentile, and between the $95^{th}$ and $100^{th}$ percentile. It can be seen from curves 602-604 that, as described above with reference to FIGS. 5A-5B, the loudness loss for the vocals, guitar and drums is significant in frequencies below about 200 Hz, while the loudness loss for the bass guitar is low in this frequency range, thus indicating that the bass guitar commonly masks the vocals, guitar and drums in this frequency range.

It can also be seen from curve 602 that there is an increase in median loudness loss for the vocals at approximately 3.5-4.0 kHz, and from curve 603 that there is a corresponding decrease in median loudness loss for the guitar at approximately 3.5-4.0 kHz, indicating that vocals are commonly masked by the guitar in this frequency range.

One aspect of the invention lies in the Assignee's recognition that (1) a certain amount of sound masking may be inevitable whenever there are multiple instruments represented in a multi-track recording, as illustrated by the median loudness loss curves in FIGS. 6A-6D showing at least some loudness loss throughout the frequency spectrum for all of the instruments represented; and (2) at least some of this sound masking may not be correctable via equalization. To identify the sound masking which a user e.g., a professional sound engineer) may consider problematic, and to determine the extent to which such masking is correctable, the Assignee compared a set of "effectively" mixed stems to a set of "poorly" mixed stems. Specifically, the "effectively" mixed stems were taken from the MedleyDB, which is a dataset of annotated, royalty-free multitrack recordings for non-commercial use and academic research. As the recordings in the MedleyDB were mixed by professional sound engineers, it was assumed that the corresponding stems were mixed (i.e., had equalization parameters set) effectively. "Poorly" mixed stems were created by randomly modifying various equalization parameters for the same tracks.

Figure 7:
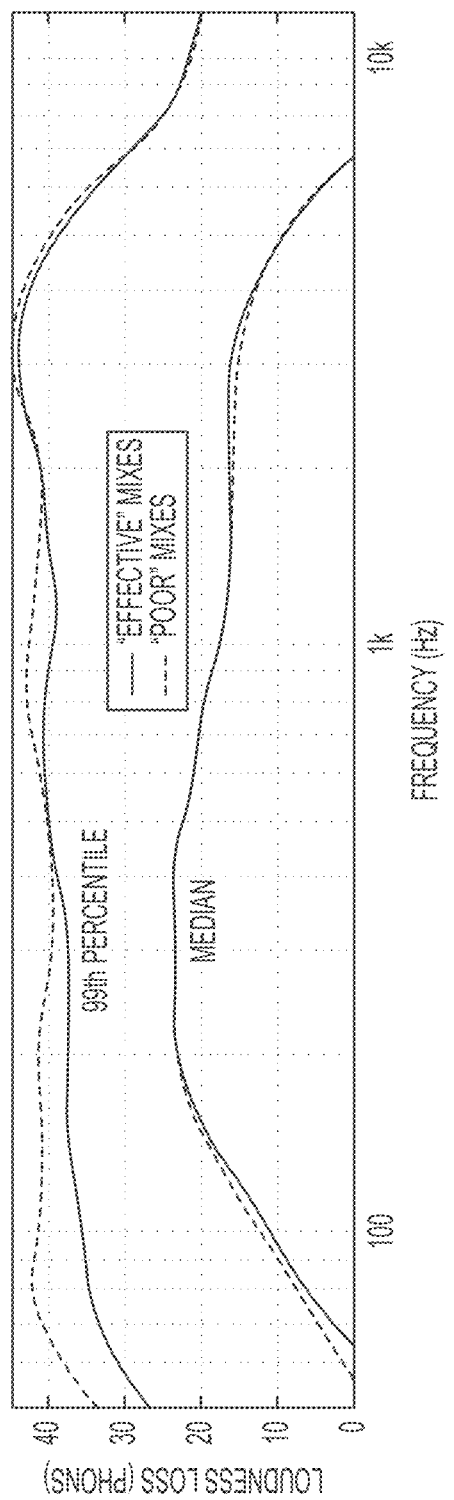
FIG. 7 is a plot illustrating a comparison between effectively mixed stems and poorly mixed stems, according to some non-limiting embodiments of the invention.

FIG. 7 is a plot which shows loudness loss as a function of frequency for the "effectively" and "poorly" mixed stems. In particular, FIG. 7 shows median loudness loss and loudness loss in the $99^{th}$ percentile for both types of stems. It can be seen in FIG. 7 that the difference in loudness loss between "effectively" and "poorly" mixed stems is relatively small at the median, indicating that any difference in loudness loss between "effectively" and "poorly" mixed tracks may not be correctable through straightforward adjustment of equalization parameters. It can also be seen in FIG. 7, however, that the difference in loudness loss at the $99^{th}$ percentile between "effectively" and "poorly" mixed tracks is more significant, suggesting that this loudness loss may be correctable via equalization. The fact that loudness loss in the $99^{th}$ percentile or greater is of much greater magnitude than loudness loss at the median suggests also that it may be the loudness loss which users may consider problematic.

As a result of this recognition, some embodiments of the invention employ a loudness loss threshold which is defined by the magnitude of loudness loss for a masking event being in the $99^{th}$ percentile or greater, to identify which masking events are to be identified to a user (e.g., defined in act 274 of representative process 250 shown in FIG. 2). It should be appreciated, however, that any suitable loudness loss threshold may be used. It should also be appreciated that a loudness loss threshold need not be based on the magnitude of loudness loss. If a threshold based upon the magnitude of loudness loss is used, the threshold may be defined in any suitable way. For example, such a threshold may be set so as to identify to the user only the masking events having associated loudness loss in the $95^{th}$ percentile of greater, in the $90^{th}$ percentile or greater, in the $80^{th}$ percentile or greater, and/or to any other suitable value(s).

IV. Enabling a User to Address Sound Masking

As noted above, some embodiments of the invention are directed to enabling a user to view and/or remediate sound masking, as the user desires. For example, some embodiments may provide a graphical user interface with which a user may view information on masking affecting one or more tracks in a multi-track recording, and apply one or more corrective measures to address sound masking in one or more stems.

Figure 8A:
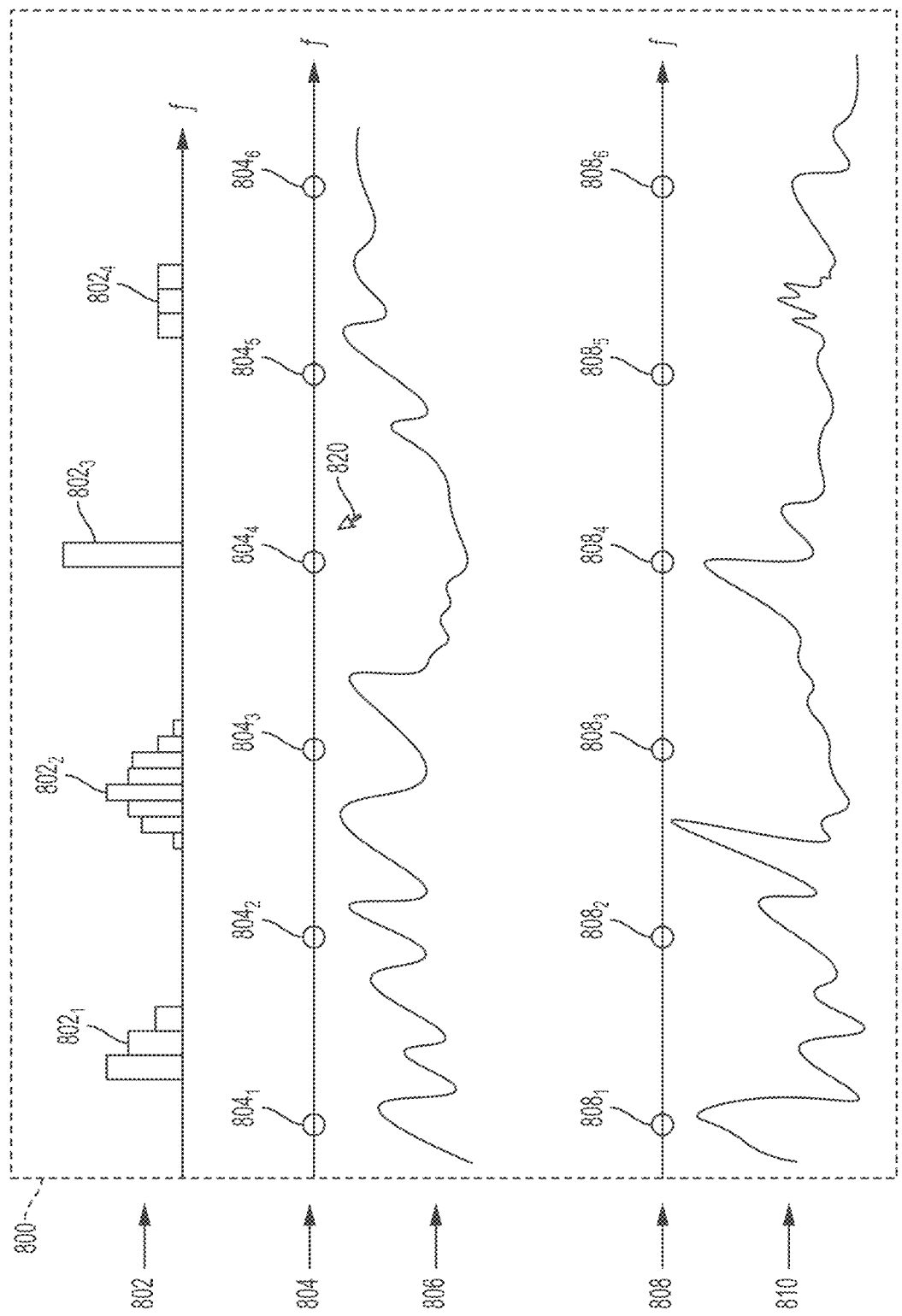
FIGS. 8A-8B schematic diagrams illustrating examples of graphical user interfaces, according to some non-limiting embodiments of the invention.
Figure 8B:
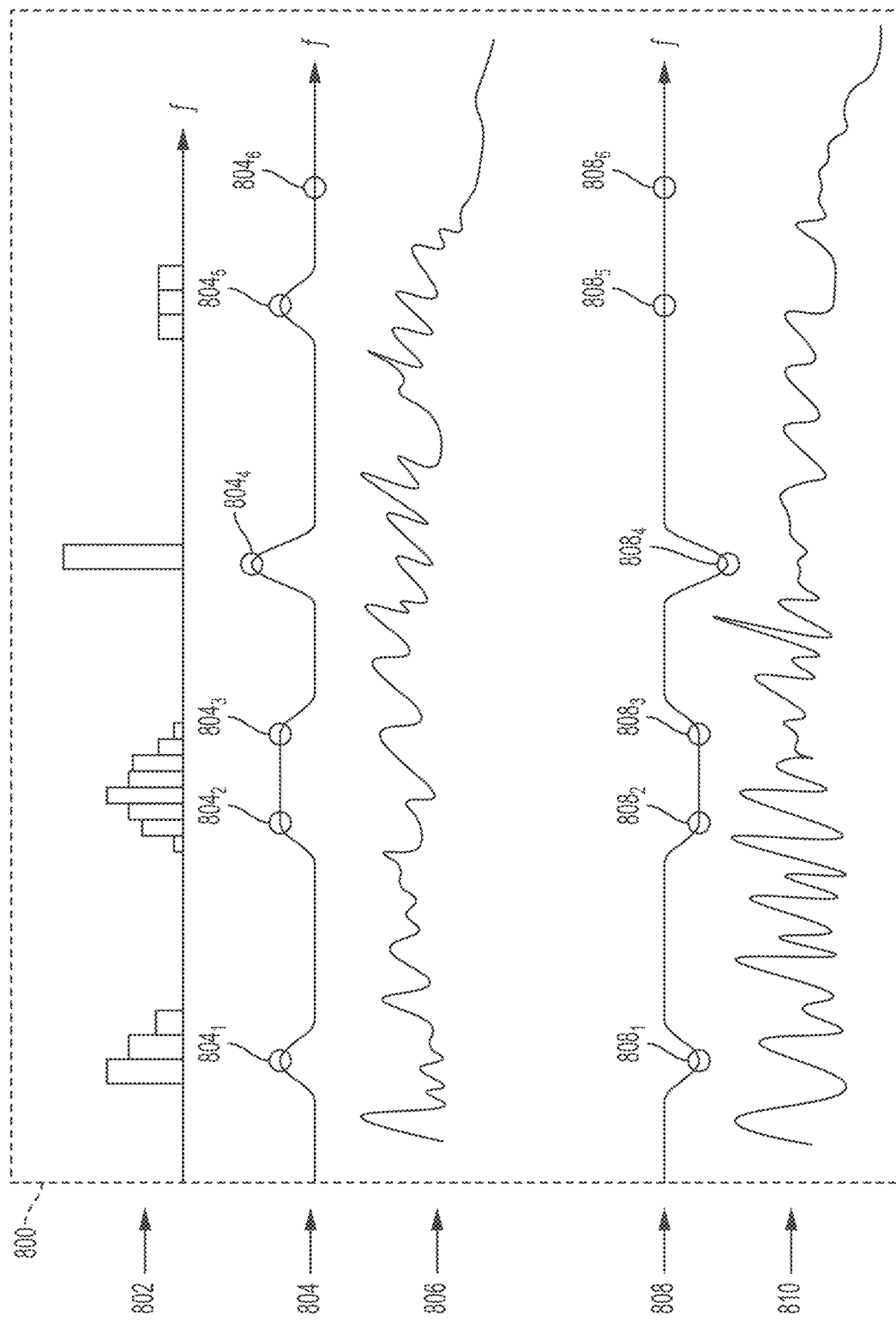

FIGS. 8A-8B depict a representative graphical user interface 800 for displaying information on sound masking affecting a track in a multi-track recording, as the multi-track recording is being replayed in real time, so that the user may apply corrective measures as desired. Graphical user interface 800 includes area 806 for displaying a curve representing a stem of interest and area 810 for displaying a curve representing one or more masking stems. In the example depicted, the curves in areas 806 and 810 show sound pressure as a function of frequency.

Graphical user interface 800 includes area 802 for displaying information on sound masking. Specifically, area 802 displays a bar graph indicating a number of loudness loss events satisfying a loudness loss threshold that have occurred as the multi-track recording was replayed in each of a plurality of frequency ranges. In the example shown, the height of each bar in the bar graph corresponds to the number of loudness loss events satisfying a loudness loss threshold (e.g., as determined by performing representative process 250 shown in FIG. 2) which occurred at the considered frequency. It can be seen in FIG. 8A that the bars labeled $802_2$ indicate a number of loudness loss events roughly akin to a bell curve occurring within a particular frequency band; that the bars labeled $802_1$ indicate a number of loudness loss events occurring within another frequency band, with the greatest number of loudness loss events occurring at the lowest frequency within the band; and that the bar labeled $802_3$ indicates a significant number of loudness loss events occurring within a localized frequency range. Although graphical user interface 800 uses a bar graph to identify loudness loss events, any suitable representation(s) may be used to convey information on sound masking to a user.

In some embodiments, the bar graph shown in area 802 may indicate a number of loudness loss events occurring within a particular period of time prior to display. For example, the bar graph may indicate a number of loudness loss events satisfying a loudness loss threshold which occurred 0.5 second prior to display, 1 second prior to display, 3 seconds prior to display, etc. Use of a rolling time interval in this manner may allow a user to see how the way in which sound masking affects a stem at different frequencies varies over time. It may also ensure that the information provided to the user is timely (e.g., it does not relate to sound masking which occurred ten seconds ago), so that any corrective measures the user may desire are applied at the point in time when they are most beneficial.

Additionally or alternatively, some embodiments of the invention may only identify loudness loss events to a user if the associated masking occurs for at least a threshold amount of time. In this way, these embodiments may avoid needlessly notifying the user of fleeting or one-time masking events. As an example, in some embodiments the bar graph shown in area 802 may only reflect a loudness loss event in a particular frequency range if the event occurred for at least 0.5 seconds, for at least 1 second, for at least 3 seconds, etc. Any suitable amount of time may be used for this purpose.

Using the representative graphical user interface shown in FIG. 8A, a user may quickly and easily identify the frequency ranges in which sound masking is most pronounced, rather than relying on an inefficient trial-and-error process to do so. As a result, the user may quickly focus any corrective action desired on the affected frequency ranges, saving time and computational resources, and making the audio production process more enjoyable and satisfying overall.

Graphical user interface 800 includes controls for applying such corrective measures. Specifically, graphical user interface 800 includes controls for adjusting equalization parameters for the stem of interest and for the masking stem(s). These controls are provided in control areas 804 and 808, respectively. In some embodiments, these controls may enable a user to apply filters to boost or attenuate the signal for the stem of interest and/or the masking stem(s) in certain frequency ranges. In the example shown, the controls for the stem of interest include those labeled $804_1$, $804_2$, $804_3$, $804_4$, $804_5$, and $804_6$, the controls for the masking stem(s) include those labeled $808_1$, $808_2$, $808_3$, $808_4$, $808_5$, and $808_6$. It should be appreciated that any other suitable number of filter controls may be used to adjust equalization parameters for the stem of interest and for the masking stem(s).

In some embodiments, a user may adjust equalization parameters for the stem of interest by dragging (e.g., using a mouse, touch screen, voice controls, etc.) one or more of controls $804_n$ to change the position of the control(s) within control area 804, and for the masking stem(s) by dragging a control $808_n$ to change the position of the control(s) within control area 808. For example, the user may (for example) use a cursor provided by graphical user interface 800 to adjust the position of a control within a control area. An example is shown in FIG. 8B. Specifically, FIG. 8B shows that controls $804_1$, $804_2$, $804_3$, $804_4$, and $804_5$ have been moved from their original locations within control area 804 shown in FIG. 8A. In the example shown, this movement is performed to boost the stem of interest signal in frequency ranges where loudness loss has occurred, by moving a control $804_n$ upward (thereby increasing the amplitude of a corresponding filter) and/or laterally to a location proximate the considered frequency range (thereby shifting the center frequency of the corresponding filter to within the range) within control area 804. FIG. 8B also shows that controls $808_1$, $808_2$, $808_3$, and $804_4$ have been moved from their original locations within control area 808 shown in FIG. 8A. Specifically, controls $808_n$ have been moved downward (thereby decreasing the amplitude of a corresponding filter) and/or laterally to locations proximate the frequency ranges where loudness loss has occurred (shifting the center frequency of each corresponding filter to within the range), so as to attenuate the masking stem(s) signal in the considered frequency ranges. Of course, a user may modify the location of a control $804_n$ or $808_n$ to achieve objectives other than remediating loudness loss within a frequency range. For example, the user may modify the location of a control to apply filters to improve perceived sound quality.

Although not shown in FIGS. 8A-8B, in some embodiments, a graphical user interface may provide controls which enable a user to modify a loudness loss threshold, so that more loudness loss events (e.g., if the loudness loss threshold is adjusted downward) or less loudness loss events (e.g., if the loudness loss threshold is adjusted upward) are identified to the user. A graphical user interface implemented in accordance with the invention may provide any suitable controls for performing any suitable audio production-related tasks.

V. Implementation Detail

Figure 9:
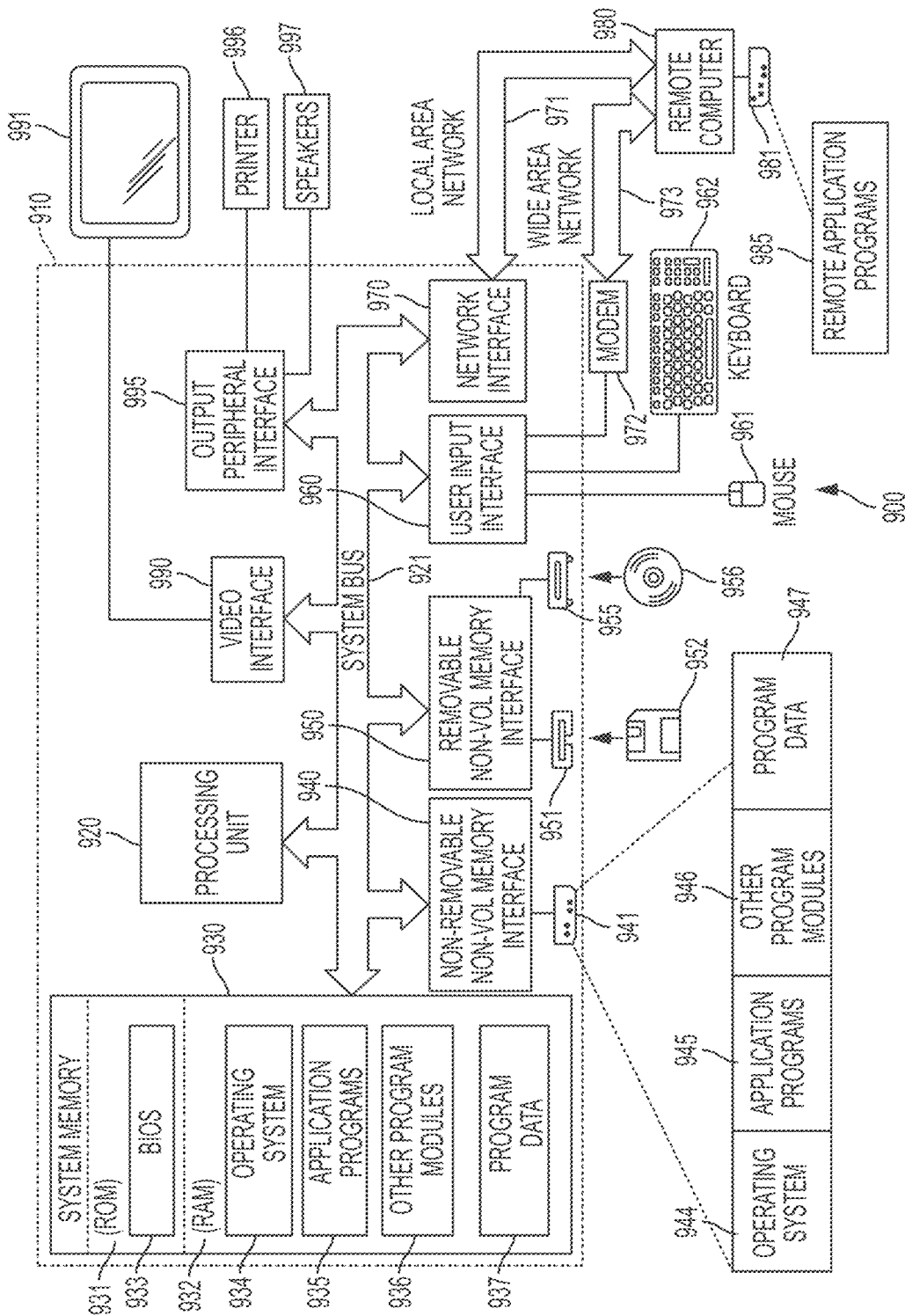
FIG. 9 is a block diagram illustrating a computer system, according to some non-limiting embodiments of the invention.

It should be appreciated from the foregoing that some embodiments of the invention may be implemented using a computer. For example, representative system 300 (FIGS. 3A-3B) may be implemented at least in part using a computer. FIG. 9 depicts a general purpose computing device, in the form of a computer 910, which may be used to implement certain aspects of the invention. In computer 910, components include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 910 typically includes a variety of computer readable media. Computer readable media can be any available media that can be accessed by computer 910 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other one or more media which may be used to store the desired information and may be accessed by computer 910. Communication media typically embody computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of the any of the above should also be included within the scope of computer readable media.

The system memory 930 includes computer storage media in the form of volatile and/or nonvolatile memory such as read only memory (ROM) 931 and random access memory (RAM) 932. A basic input/output system 933 (BIOS), containing the basic routines that help to transfer information between elements within computer 910, such as during start-up, is typically stored in ROM 931. RAM 932 typically contains data and/or program modules that are immediately accessible to and/or presently being operated on by processing unit 920. By way of example, and not limitation, FIG. 9 illustrates operating system 934, application programs 935, other program modules 939, and program data 937.

The computer 910 may also include other removable/non-removable, volatile/nonvolatile computer storage media. By way of example only, FIG. 9 illustrates a hard disk drive 941 that reads from or writes to non-removable, nonvolatile magnetic media, a magnetic disk drive 951 that reads from or writes to a removable, nonvolatile magnetic disk 952, and an optical disk drive 955 that reads from or writes to a removable, nonvolatile optical disk 959 such as a CD ROM or other optical media. Other removable/non-removable, volatile/nonvolatile computer storage media that can be used in the exemplary computing system include, but are not limited to, magnetic tape cassettes, flash memory cards, digital versatile disks, digital video tape, solid state RAM, solid state ROM, and the like. The hard disk drive 941 is typically connected to the system bus 921 through an non-removable memory interface such as interface 940, and magnetic disk drive 951 and optical disk drive 955 are typically connected to the system bus 921 by a removable memory interface, such as interface 950.

The drives and their associated computer storage media discussed above and illustrated in FIG. 9, provide storage of computer readable instructions, data structures, program modules and other data for the computer 910. In FIG. 9, for example, hard disk drive 941 is illustrated as storing operating system 944, application programs 945, other program modules 949, and program data 947. Note that these components can either be the same as or different from operating system 934, application programs 935, other program modules 539, and program data 937. Operating system 944, application programs 945, other program modules 949, and program data 947 are given different numbers here to illustrate that, at a minimum, they are different copies. A user may enter commands and information into the computer 910 through input devices such as a keyboard 992 and pointing device 991, commonly referred to as a mouse, trackball or touch pad. Other input devices (not shown) may include a microphone, joystick, game pad, satellite dish, scanner, or the like. These and other input devices are often connected to the processing unit 920 through a user input interface 590 that is coupled to the system bus, but may be connected by other interface and bus structures, such as a parallel port, game port or a universal serial bus (USB). A monitor 991 or other type of display device is also connected to the system bus 921 via an interface, such as a video interface 990. In addition to the monitor, computers may also include other peripheral output devices such as speakers 997 and printer 999, which may be connected through a output peripheral interface 995.

The computer 910 may operate in a networked environment using logical connections to one or more remote computers, such as a remote computer 980. The remote computer 980 may be a personal computer, a server, a router, a network PC, a peer device or other common network node, and typically includes many or all of the elements described above relative to the computer 910, although only a memory storage device 981 has been illustrated in FIG. 9. The logical connections depicted in FIG. 9 include a local area network (LAN) 971 and a wide area network (WAN) 973, but may also include other networks. Such networking environments are commonplace in offices, enterprise-wide computer networks, intranets and the Internet.

When used in a LAN networking environment, the computer 910 is connected to the LAN 971 through a network interface or adapter 970. When used in a WAN networking environment, the computer 910 typically includes a modem 972 or other means for establishing communications over the WAN 973, such as the Internet. The modem 972, which may be internal or external, may be connected to the system bus 921 via the user input interface 990, or other appropriate mechanism. In a networked environment, program modules depicted relative to the computer 910, or portions thereof, may be stored in the remote memory storage device. By way of example, and not limitation, FIG. 9 illustrates remote application programs 985 as residing on memory device 981. It will be appreciated that the network connections shown are exemplary and other means of establishing a communications link between the computers may be used.

Embodiments of the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a tangible machine, mechanism or device from which a computer may read information. Alternatively or additionally, the invention may be embodied as a computer readable medium other than a computer-readable storage medium. Examples of computer readable media which are not computer readable storage media include transitory media, like propagating signals.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing, and it is, therefore, not limited in its application to the details and arrangement of components set forth in the foregoing description or illustrated in the drawings. For example, aspects described in one embodiment may be combined in any manner with aspects described in other embodiments.

The invention may be embodied as a method, of which various examples have been described. The acts performed as part of the method may be ordered in any suitable way. Accordingly, embodiments may be constructed in which acts are performed in an order different than illustrated, which may include different (e.g., more or less) acts than those which are described, and/or which may involve performing some acts simultaneously, even though the acts are shown as being performed sequentially in the embodiments specifically described above.

Use of ordinal terms such as "first," "second," "third," etc., to modify an element does not by itself connote any priority, precedence, or order of one claim element over another or the temporal order in which acts of a method are performed, but are used merely as labels to distinguish one element having a certain name from another element having the same name (but for use of the ordinal term) to distinguish the elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A method comprising acts of:
   (A) identifying a plurality of sound masking events in which sound in a first audio recording during a time period in a frequency range is masked by sound in a second audio recording during the time period in the frequency range, each sound masking event having an associated loudness loss defining a magnitude of the sound masking event, the loudness loss associated with each sound masking event being based at least in part on a difference between a loudness of the sound in the first audio recording occurring in isolation and a partial loudness of the sound in the first audio recording occurring concurrently with the sound in the second audio recording;
   (B) identifying a subset of the plurality of sound masking events as having a greater associated loudness loss than others of the plurality of sound masking events; and
   (C) causing a representation of the identified subset of the plurality of sound masking events to be displayed to a user on a graphical user interface.

2. The method of claim 1, wherein the act (B) comprises identifying sound masking events having an associated loudness loss in the $99^{th}$ percentile or greater.

3. The method of claim 1, wherein the act (B) comprises identifying sound masking events having an associated loudness loss in the $95^{th}$ percentile or greater.

4. The method of claim 1, wherein the act (B) comprises identifying sound masking events having an associated loudness loss in the $90^{th}$ percentile or greater.

5. The method of claim 1, wherein the act (B) comprises identifying sound masking events having an associated loudness loss in the $80^{th}$ percentile or greater.

6. The method of claim 1, wherein the representation which is caused to be displayed in the act (C) is a bar graph in which each bar represents a number of sound masking events in the identified subset observed in a frequency range.

7. The method of claim 6, wherein each bar represents a number of sound masking events in the identified subset occurring within a predetermined amount of time prior to display.

8. The method of claim 6, wherein each bar represents a number of sound masking events in the identified subset occurring for at least a predetermined amount of time.

9. The method of claim 1, wherein the act (C) comprises causing display of a graphical user interface providing controls for adjusting equalization parameters for at least one of the first audio recording and the second audio recording.

10. The method of claim 9, wherein the controls enable a user to increase an amplitude of a filter applied to at least one of the first audio recording and the second audio recording in a frequency range, decrease an amplitude of a filter applied to at least one of the first audio recording and the second audio recording in a frequency range, and/or modify a center frequency at which a filter is applied to at least one of the first audio recording and the second audio recording.

11. The method of claim 1, wherein the act (C) comprises causing display of a graphical user interface providing controls for adjusting a threshold loudness loss defining how many sound masking events are included in the subset.

12. At least one non-transitory computer-readable storage medium having instructions encoded thereon which, when executed in a computing system, cause the computing system to perform a method comprising acts of:
   (A) identifying a plurality of sound masking events in which sound in a first audio recording during a time period in a frequency range is masked by sound in a second audio recording during the time period in the frequency range, each sound masking event having an associated loudness loss defining a magnitude of the sound masking event, the loudness loss associated with each sound masking event being based at least in part on a difference between a loudness of the sound in the first audio recording occurring in isolation and a partial loudness of the sound in the first audio recording occurring concurrently with the sound in the second audio recording;
   (B) identifying a subset of the plurality of sound masking events as having a greater associated loudness loss than others of the plurality of sound masking events; and
   (C) causing a representation of the identified subset of the plurality of sound masking events to be displayed to a user on a graphical user interface.

13. A system, comprising:
   at least one computer-readable storage medium, having instructions encoded thereon; and
   at least one computer processor, programmed via the instructions to:
      identify a plurality of sound masking events in which sound in a first audio recording during a time period in a frequency range is masked by sound in a second audio recording during the time period in the frequency range, each sound masking event having an associated loudness loss defining a magnitude of the sound masking event, the loudness loss associated with each sound masking event being based at least in part on a difference between a loudness of the sound in the first audio recording occurring in isolation and a partial loudness of the sound in the first audio recording occurring concurrently with the sound in the second audio recording;

identify a subset of the plurality of sound masking events as having a greater associated loudness loss than others of the plurality of sound masking events; and cause a representation of the identified subset of the plurality of sound masking events to be displayed to a user via a graphical user interface.

14. The system of claim 13, wherein the at least one computer processor is programmed via the instructions to identify sound masking events having an associated loudness loss in the 99$^{th}$ percentile or greater.

15. The system of claim 13, wherein the at least one computer processor is programmed via the instructions to cause to be displayed a representation comprising a bar graph in which each bar represents a number of sound masking events in the identified subset observed in a frequency range.

16. The system of claim 15, wherein each bar represents a number of sound masking events in the identified subset occurring within a predetermined amount of time prior to display.

17. The system of claim 16, wherein each bar represents a number of sound masking events in the identified subset occurring for at least a predetermined amount of time.

18. The system of claim 13, wherein the at least one computer processor is programmed via the instructions to cause display of a graphical user interface providing controls for adjusting equalization parameters for at least one of the first audio recording and the second audio recording.

19. The system of claim 18, wherein the controls enable a user to increase an amplitude of a filter applied to at least one of the first audio recording and the second audio recording in a frequency range, decrease an amplitude of a filter applied to at least one of the first audio recording and the second audio recording in a frequency range, and/or modify a center frequency at which a filter is applied to at least one of the first audio recording and the second audio recording.

20. The system of claim 13, wherein the at least one computer processor is programmed via the instructions to cause display of a graphical user interface providing controls for adjusting a threshold loudness loss defining how many sound masking events are included in the subset.

* * * * *